(12) United States Patent
Yang et al.

(10) Patent No.: US 8,779,784 B2
(45) Date of Patent: Jul. 15, 2014

(54) INSULATION RESISTANCE MEASURING CIRCUIT FREE FROM INFLUENCE OF BATTERY VOLTAGE

(75) Inventors: Jeong Hwan Yang, Busan (KR); Ki Seok Choi, Namyangju-si (KR); Jae Hwan Lim, Daejeon (KR)

(73) Assignee: SK Innovation Co., Ltd., Seoul (KR)

( * ) Notice: Subject to any disclaimer, the term of this patent is extended or adjusted under 35 U.S.C. 154(b) by 507 days.

(21) Appl. No.: 13/257,831

(22) PCT Filed: Mar. 23, 2010

(86) PCT No.: PCT/KR2010/001790
§ 371 (c)(1),
(2), (4) Date: Sep. 20, 2011

(87) PCT Pub. No.: WO2010/110589
PCT Pub. Date: Sep. 30, 2010

(65) Prior Publication Data
US 2012/0016613 A1 Jan. 19, 2012

(30) Foreign Application Priority Data

Mar. 23, 2009 (KR) .................. 10-2009-0024341

(51) Int. Cl.
*G01R 27/08* (2006.01)
*G01R 27/16* (2006.01)
*G01R 31/36* (2006.01)

(52) U.S. Cl.
CPC ............... *G01R 27/08* (2013.01); *G01R 27/16* (2013.01); *G01R 31/362* (2013.01); *G01R 31/3658* (2013.01)
USPC ........... 324/691; 324/541; 324/544; 324/551; 324/430; 324/426; 324/427; 324/428; 324/429; 324/431; 324/432

(58) Field of Classification Search
CPC ...... G01R 27/08; G01R 27/16; G01R 31/362; G01R 31/3658
USPC .................. 324/426–437, 541, 544, 551, 691
See application file for complete search history.

(56) References Cited

U.S. PATENT DOCUMENTS 4,816,768 A * 3/1989 Champlin .................. 324/428
6,002,238 A * 12/1999 Champlin .................. 320/134
(Continued)

FOREIGN PATENT DOCUMENTS

CN 1229195 A 9/1999
JP 2000152510 A 5/2000
(Continued)

OTHER PUBLICATIONS

Li et al., "Research on Insulation On-Line Monitiring for Electric Vehicle", Electrical Machines and Systems, Sep. 27-29, 2005, p. 814-817.*

(Continued)

*Primary Examiner* — Patrick Assouad
*Assistant Examiner* — Lamarr Brown
(74) *Attorney, Agent, or Firm* — The Webb Law Firm

(57) ABSTRACT

Provided is an insulation resistance measuring circuit including: a source resistor unit including a first source resistor connected between a positive terminal of a battery and a second source resistor and the second source resistor connected between a negative terminal of the battery and the first source resistor; a voltage sensing unit sensing a voltage of the first source resistor as a first voltage and sensing a voltage of the second source resistor as a second voltage; and an insulation resistance measuring unit measuring an insulation resistance of the battery through a value obtained by dividing a difference between the first and second voltages by a sum between the first and second voltages.

16 Claims, 1 Drawing Sheet

(56) References Cited

U.S. PATENT DOCUMENTS

| | | | |
|---|---|---|---|
| 6,236,215 B1* | 5/2001 | Kanehira | 324/429 |
| 6,262,563 B1* | 7/2001 | Champlin | 320/134 |
| 6,456,087 B1* | 9/2002 | Kamitani | 324/523 |
| 6,466,026 B1* | 10/2002 | Champlin | 324/430 |
| 6,518,777 B2* | 2/2003 | Kamitani et al. | 324/678 |
| 6,639,410 B2* | 10/2003 | Kamitani | 324/523 |
| 6,700,384 B2 | 3/2004 | Yugou | |
| 6,731,116 B2* | 5/2004 | Yamamoto et al. | 324/522 |
| 7,317,316 B2* | 1/2008 | Leitz | 324/551 |
| 8,106,667 B2* | 1/2012 | Kawamura et al. | 324/551 |
| 8,159,230 B2* | 4/2012 | Kawamura et al. | 324/551 |
| 2001/0015647 A1* | 8/2001 | Kamitani et al. | 324/551 |
| 2003/0042909 A1* | 3/2003 | Yamamoto et al. | 324/522 |
| 2004/0100289 A1* | 5/2004 | Lull | 324/693 |
| 2004/0189330 A1* | 9/2004 | Herb et al. | 324/691 |
| 2005/0073317 A1* | 4/2005 | Yamamoto et al. | 324/503 |
| 2006/0003198 A1* | 1/2006 | Leitz | 429/13 |
| 2007/0132459 A1* | 6/2007 | Yamamoto et al. | 324/541 |
| 2007/0210805 A1* | 9/2007 | Kawamura | 324/541 |
| 2008/0054907 A1 | 3/2008 | Kudo et al. | |
| 2009/0108850 A1* | 4/2009 | Yamagami et al. | 324/551 |
| 2011/0084705 A1* | 4/2011 | Kawamura | 324/551 |
| 2012/0081135 A1* | 4/2012 | Kawamura et al. | 324/693 |
| 2013/0176042 A1* | 7/2013 | Huh | 324/693 |
| 2013/0214788 A1* | 8/2013 | Klijn | 324/430 |

FOREIGN PATENT DOCUMENTS

| | | |
|---|---|---|
| JP | 2006220520 A | 8/2006 |
| JP | 200864536 A | 3/2008 |

OTHER PUBLICATIONS

Tao et al., "Design of a High-Voltage Intelligent Insulation Resistance Tester", Automatic Control and Artificaial Intelligence (ACAI 2012), p. 807-810.*

* cited by examiner

INSULATION RESISTANCE MEASURING CIRCUIT FREE FROM INFLUENCE OF BATTERY VOLTAGE

TECHNICAL FIELD

The present invention relates to an insulation resistance measuring circuit, and more particularly, to an insulation resistance measuring circuit capable of more simply measuring an insulation resistance without information on a battery voltage by judging a voltage sensed through at least one single power operational amplifier (OP Amp) at the time of insulation breakdown of a cathode of a battery and insulation breakdown of an anode thereof through the at least one single power OP Amp based on a voltage of the battery and capable of more precisely measuring the insulation resistance by amplifying a voltage and then subtracting a predetermined reference voltage from the amplified voltage.

BACKGROUND ART

A hybrid vehicle using a high voltage battery includes a system automatically cutting off a power of a main high voltage battery at the time of generation of an emergency. The emergency means excessive electric leakage, insulation breakdown, or the like, due to aging of related components and excessive electric leakage, insulation breakdown, or the like, caused by a short circuit due to the destroy of components by external impact.

When the emergency is generated in a vehicle, an upper component controlling a high voltage component, such as a battery management system (BMS), a hybrid control unit (HCU), or the like, issues a command to cut off a main power to thereby cut off the power. The high voltage related component monitors a voltage and a current of a line connecting a power supply thereto through a series of programs or sensors and cuts off the main power through controller area network (CAN) communication or signal transmission when a voltage and a current that are out of a normal range are detected or there is a leakage current more than a tolerance and when there is insulation resistance breakdown more than a tolerance, or the like.

As such, it is very important to measure the insulation resistance in the hybrid vehicle using the high voltage battery. As a method for measuring a leakage current between a high voltage battery and a hybrid vehicle, there is a method of breaking down insulation and allowing a DC current to forcedly flow. This method has a disadvantage in that the insulation is broken down during measurement of an insulation resistance.

As a method for solving this problem, there is a method of connecting a coupling capacitor between a high voltage battery and a hybrid vehicle and applying an AC signal to the coupling capacitor to thereby measure an insulation resistance component. However, this method also has a disadvantage in that since a current for charging the coupling capacitor and a current discharged from the coupling capacitor should pass through the same circuit, there are many limitations in designing the circuit.

Therefore, in measuring an insulation resistance between a chassis ground of a hybrid vehicle and a high voltage battery, the demand for developing a small-sized, light, and a low cost insulation resistance measuring circuit capable of more simply and precisely measuring the insulation resistance has increased.

Technical Problem

An object of the present invention is to provide an insulation resistance measuring circuit capable of more simply measuring an insulation resistance without information on a battery voltage by judging a voltage sensed through at least one single power operational amplifier (OP Amp) at the time of insulation breakdown of a cathode of a battery and insulation breakdown of an anode thereof through the at least one single power OP Amp based on a voltage of the battery.

Another object of the present invention is to provide an insulation resistance measuring circuit capable of more precisely measuring the insulation resistance by amplifying a voltage and then subtracting a predetermined reference voltage from the amplified voltage.

Technical Solution

In one general aspect, an insulation resistance measuring circuit includes: a source resistor unit including a first source resistor connected between a positive terminal of a battery and a second source resistor and the second source resistor connected between a negative terminal of the battery and the first source resistor; a voltage sensing unit sensing a voltage of the first source resistor as a first voltage and sensing a voltage of the second source resistor as a second voltage; and an insulation resistance measuring unit measuring an insulation resistance of the battery through a value obtained by dividing a difference between the first and second voltages by a sum between the first and second voltages.

In another general aspect, an insulation resistance measuring circuit includes: a source resistor unit including a first source resistor connected between a positive terminal of a battery and a second source resistor and the second source resistor connected between a negative terminal of the battery and the first source resistor; a first operational amplifier (OP Amp) connected to the first source resistor through a non-inverting terminal and an inverting terminal thereof, sensing a first source voltage applied to the first source resistor as the first voltage, and outputting the sensed first source voltage through an output terminal thereof; a second OP Amp connected to the second source resistor through a non-inverting terminal and an inverting terminal thereof, sensing a second source voltage applied to the second source resistor as the second voltage, and outputting the sensed second source voltage through an output terminal thereof; an analog to digital converter connected to each of output terminals of the first and second OP Amps, converting each of the first and second voltages into digital signals, and outputting first and second voltage signals; and a microcontroller measuring an insulation resistance of the battery through a value obtained by dividing a difference between the first voltage of the first voltage signal and the second voltage of the second voltage signal by a sum between the first voltage of the first voltage signal and the second voltage of the second voltage signal.

Advantageous Effects

With the insulation resistance measuring circuit according to the exemplary embodiments of the present invention, a voltage sensed through at least one single power OP Amp at the time of insulation breakdown of a cathode of a battery and insulation breakdown of an anode thereof through the at least one single power OP Amp is judged based on a voltage of the battery, thereby making it possible to more simply measure an insulation resistance without information on a battery voltage.

In addition, with the insulation resistance measuring circuit according to the exemplary embodiments of the present invention, a voltage is amplified and a predetermined reference voltage is subtracted from the amplified voltage, thereby making it possible to more precisely measure the insulation resistance.

DESCRIPTION OF DRAWINGS

The above and other objects, features and advantages of the present invention will become apparent from the following description of preferred embodiments given in conjunction with the accompanying drawings, in which.

BEST MODE

Hereinafter, exemplary embodiments of the present invention will be described in detail with reference to the accompanying drawings.

Figure 1:
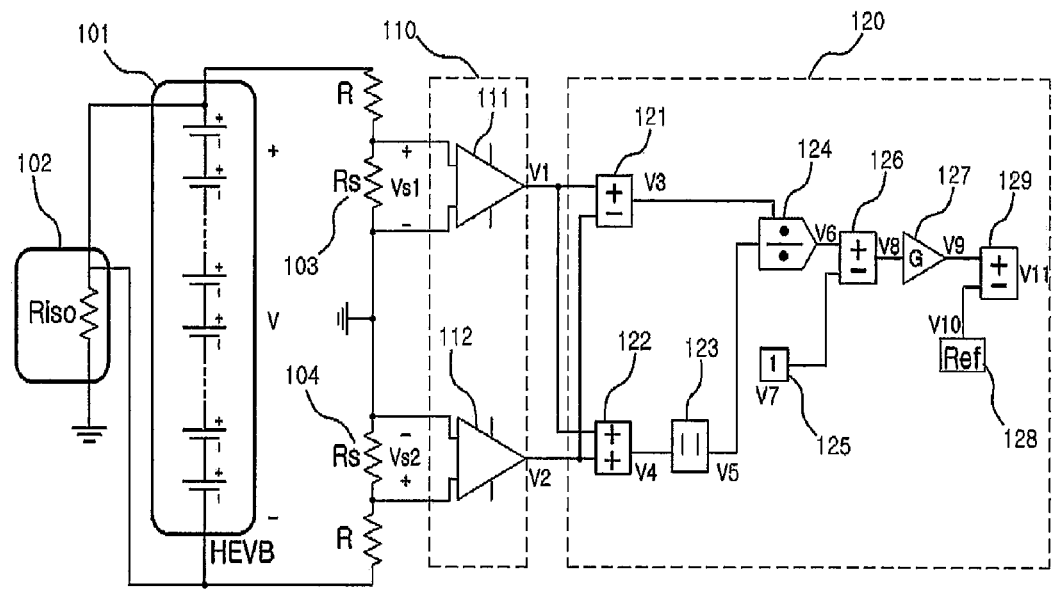
FIG. 1 is a circuit diagram showing a configuration of an insulation resistance measuring circuit according to an exemplary embodiment of the present invention.

FIG. 1 is a circuit diagram showing a configuration of an insulation resistance measuring circuit according to an exemplary embodiment of the present invention.

As shown in FIG. 1, an insulation resistance measuring analog circuit according to an exemplary embodiment of the present invention includes a battery 101, an insulation resistor 102, a source resistor unit 103 and 104, a voltage sensing unit 110, and an insulation resistance measuring unit 120.

According to the exemplary embodiment of the present invention, the source resistor unit includes a first source resistor 103 and a second source resistor 104, as shown in FIG. 1. In addition, the voltage sensing unit 110 includes a first circuit unit 111 and a second circuit unit 112. Further, the insulation resistance measuring unit 120 includes a first subtracter 121, an adder 122, an absolute value circuit 123, a divider 124, a voltage source 125, a second subtracter 126, an amplifier 127, a reference voltage outputter 128, and a third subtracter 129.

The source resistor unit includes the first source resistor 103 connected between a positive terminal of the battery 101 and the second source resistor 104 and the second source resistor 104 connected between a negative terminal of the battery 101 and the first source resistor 103. That is, as shown in FIG. 1, the first source resistor $R_s$ 103 is may be connected to the positive terminal of the battery 101 through a resistor R, and the second source resistor $R_s$ 104 may be connected to the negative terminal of the battery 101 through a resistor R. The first source resistor $R_s$ 103 and the second source resistor $R_s$ 104 may be connected to each other through a ground.

The voltage sensing unit 110 senses a voltage of the first source resistor 103 as a first voltage and senses a voltage of the second source resistor 104 as a second voltage. As described above, the voltage sensing unit 110 includes the first circuit unit 111 and the second circuit unit 112.

The first circuit unit 111 includes a first operational amplifier (OP Amp). Each of a non-inverting terminal and an inverting terminal of the first OP Amp may be connected to both ends of the first source resistor 103. The first circuit unit 111 may sense a first source voltage applied to the first source resistor 103 through the first OP Amp as the first voltage and output the sensed first source voltage through an output terminal thereof.

The second circuit unit 112 includes a second OP Amp. Each of a non-inverting terminal and an inverting terminal of the second OP Amp may be connected to both ends of the second source resistor 104. The second circuit unit 112 may sense a second source voltage applied to the second source resistor 104 through the second OP Amp as a second source voltage and output the sensed second source voltage through an output terminal thereof.

The insulation resistance measuring unit 120 measures an insulation resistance 102 of the battery 101 through a value obtained by dividing a difference between the first and second voltages by a sum between the first and second voltages. Further, the insulation resistance measuring unit 120 includes the first subtracter 121, the adder 122, the absolute value circuit 123, the divider 124, the voltage source 125, the second subtracter 126, the amplifier 127, the reference voltage outputter 128, and the third subtracter 129.

The first subtracter 121 may be connected to each of an output terminal of the first OP Amp and an output terminal of the second OP Amp. The first subtracter 121 receives the first voltage output from the output terminal of the first OP Amp and the second voltage output from the output terminal of the second OP Amp and outputs a third voltage obtained by subtracting the second voltage from the first voltage.

The adder 122 may be connected to each of the output terminal of the first OP Amp and the output terminal of the second OP Amp. The adder 122 receives the first voltage output from the output terminal of the first OP Amp and the second voltage output from the output terminal of the second OP Amp and outputs a fourth voltage obtained by adding the second voltage to the first voltage.

The absolute value circuit 123 may be connected to an output terminal of the adder 122 and receives the fourth voltage from the output terminal of the adder 122 and outputs an absolute value of the fourth voltage as a fifth voltage.

The divider 124 may be connected to each of an output terminal of the first subtracter 121 and an output terminal of the second OP Amp. The divider 124 receives the third voltage output from the first subtracter 121 and the fifth voltage output from the absolute value circuit 123 and outputs a sixth voltage obtained by dividing the third voltage by the fifth voltage.

The second subtracter 126 may be connected to each of an output terminal of the divider 124 and an output terminal of the voltage source 125. The second subtract 126 receives the sixth voltage output from the divider 124 and a seventh voltage output from the voltage source 125 and outputs an eighth voltage obtained by subtracting the seventh voltage from the sixth voltage.

The insulation resistance measuring unit 120 may further include any one or more of the amplifier 127, the reference voltage outputter 128, and the third subtracter 129 in order to more precisely measure the insulation resistance 102.

The amplifier 127 may be connected to an output terminal of the second subtracter 124 and receives the eighth voltage from the output terminal of the second subtracter 124 and outputs a ninth voltage obtained by amplifying the eighth voltage through multiplication between the eighth voltage and a voltage gain G of the amplifier 127.

The third subtracter 129 may be connected to each of an output terminal of the amplifier 127 and an output terminal of the reference voltage outputter 128. The third subtract 129 receives the ninth voltage output from the amplifier 127 and a tenth voltage output from the reference voltage outputter 128 and outputs an eleventh voltage obtained by subtracting the tenth voltage from the ninth voltage.

The insulation resistance measuring unit 120 measures the insulation resistance 102 of the battery 101 through a value obtained by dividing the difference between the first and second voltages by the sum between the first and second voltages. A detailed description thereof will be provided through the following exemplary embodiment.

As shown in FIG. 1, a voltage of the battery 101 is V, the insulation resistance 102 of the battery 101 is $R_{iso}$, each of resistance values of the first and second source resistors 103 and 104 is $R_s$, the first voltage output from the first circuit unit 111 is $V_1$, the second voltage output from the second circuit unit 112 is $V_2$, the third voltage output from the first subtracter 121 is $V_3$, and the fourth voltage output from the adder 122 is $V_4$.

The first voltage measured at the time of insulation breakdown of a cathode of the battery 101 is given by Equation 1.

$$V1 = \frac{Rs}{R+Rs}\frac{Riso}{2Riso+Rs+R}V \qquad \text{Equation 1}$$

The second voltage measured at the time of the insulation breakdown of the cathode of the battery 101 is given by Equation 2.

$$V2 = -\frac{Rs}{R+Rs}\frac{Riso+Rs+R}{2Riso+Rs+R}V \qquad \text{Equation 2}$$

The third voltage measured at the time of the insulation breakdown of the cathode of the battery 101 is given by Equation 3.

$$V3 = \frac{Rs}{R+Rs}V \qquad \text{Equation 3}$$

The fourth voltage measured at the time of the insulation breakdown of the cathode of the battery 101 is given by Equation 4.

$$V4 = -\frac{Rs}{R+Rs}\frac{R+Rs}{2Riso+Rs+R}V \qquad \text{Equation 4}$$

The first voltage measured at the time of insulation breakdown of an anode of the battery 101 is given by Equation 5.

$$V1 = \frac{Rs}{R+Rs}\frac{Riso+Rs+R}{2Riso+Rs+R}V \qquad \text{Equation 5}$$

The second voltage measured at the time of the insulation breakdown of the anode of the battery 101 is given by Equation 6.

$$V2 = -\frac{Rs}{R+Rs}\frac{Riso}{2Riso+Rs+R}V \qquad \text{Equation 6}$$

The third voltage measured at the time of the insulation breakdown of the anode of the battery 101 is given by Equation 7.

$$V3 = \frac{Rs}{R+Rs}V \qquad \text{Equation 7}$$

The fourth voltage measured at the time of the insulation breakdown of the anode of the battery 101 is given by Equation 8.

$$V4 = \frac{Rs}{R+Rs}\frac{R+Rs}{2Riso+Rs+R}V \qquad \text{Equation 8}$$

Referring to Equations 1 to 8, at the time of both of the insulation breakdown of the cathode and the insulation breakdown of the anode of the battery 101, the fifth voltage may be measured as follows:

$$V5 = \frac{Rs}{R+Rs}\frac{R+Rs}{2Riso+Rs+R}V,$$

and the sixth voltage may be measured as follows:

$$V6 = 1 + \frac{2Riso}{Rs+R}$$

The eighth voltage measured at the time of the insulation breakdown of the cathode or the insulation breakdown of the anode of the battery 101 is given by Equation 9.

$$V8 = \frac{2Riso}{Rs+R} \qquad \text{Equation 9}$$

The insulation resistance of the battery 101 may be measured through the eighth voltage of Equation 9. That is, since $R_s$ and R are fixed resistance values in the eighth voltage, the eighth voltage changes in proportion to a value of $R_{iso}$, which is the insulation resistance 102 of the battery 101. Therefore, the insulation resistance 102 of the battery 101 may be measured by measuring the eighth voltage.

In order to more precisely measure the insulation resistance 102, the ninth voltage may be calculated by multiplying the eighth voltage by the voltage gain G of the amplifier 127. The ninth voltage is given by Equation 10.

$$V9 = \frac{2}{Rs+R}GRiso \qquad \text{Equation 10}$$

In order to more precisely measure the insulation resistance 102, the eleventh voltage may be calculated by receiving the reference voltage from a user and subtracting the reference voltage from the ninth voltage. The eleventh voltage is given by Equation 11.

$$V11 = \frac{2}{Rs+R}GRiso - V10 \qquad \text{Equation 11}$$

As such, the insulation resistance 102 of the battery 101 may be measured through the eleventh voltage of Equation 11. That is, since $R_s$, R, G, and $V_{10}$ are fixed resistance values in Equation 11, the eleventh voltage value may change in proportion to $R_{iso}$, which is a value of the insulation resistance 102. Therefore, the insulation resistance 102 of the battery 101 may be measured by measuring the eleventh voltage.

The insulation resistance measuring circuit according to the exemplary embodiment of the present invention described with reference to FIG. 1 may be implemented as one-chip. That is, the source resistor unit 103 and 104, the voltage sensing unit 110, and the insulation resistance measuring unit 120 may be implemented as various kinds of one-chips widely used in the art, that is, a single semiconductor chip.

Up to now, a configuration and an operation of the insulation resistance measuring circuit according to the exemplary embodiment of the present invention have been described with reference to FIG. 1. The insulation resistance measuring circuit according to the exemplary embodiment of the present invention may be implemented as an analog circuit in which the insulation resistance measuring unit 120 includes a subtracter, a divider, or the like. On the other hand, according to another exemplary embodiment of the present invention, the insulation resistance measuring unit 120 is not implemented as the analog circuit but may be implemented as a digital circuit including a microcontroller. This will be described with reference to FIG. 2.

Figure 2:
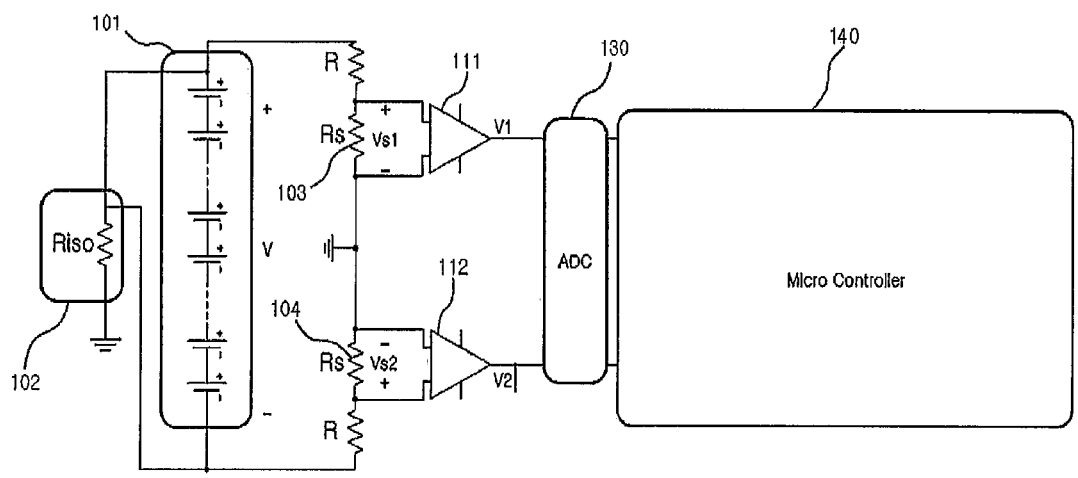
FIG. 2 is a circuit diagram showing a configuration of an insulation resistance measuring circuit according to another exemplary embodiment of the present invention.

FIG. 2 is a circuit diagram showing a configuration of an insulation resistance measuring circuit according to another exemplary embodiment of the present invention.

The insulation resistance measuring circuit according to another exemplary embodiment of the present invention may be implemented as a digital circuit including a microcontroller.

As shown in FIG. 2, the insulation resistance measuring digital circuit according to another exemplary embodiment of the present invention includes a battery 101, an insulation resistor 102, a source resistor unit 103 and 104, a first OP Amp 111, a second OP Amp 112, an analog to digital converter 130, and a microcontroller 140.

According to another exemplary embodiment of the present invention, the source resistor unit includes a first source resistor 103 and a second source resistor 104, as shown in FIG. 2.

The source resistor unit includes the first source resistor 103 connected between a positive terminal of the battery 101 and the second source resistor 104 and the second source resistor 104 connected between a negative terminal of the battery 101 and the first source resistor 103. That is, as shown in FIG. 1, the first source resistor $R_s$ 103 is may be connected to the positive terminal of the battery 101 through a resistor R, and the second source resistor $R_s$ 104 may be connected to the negative terminal of the battery 101 through a resistor R. The first source resistor $R_s$ 103 and the second source resistor $R_s$ 104 may be connected to each other through a ground.

Each of a non-inverting terminal and an inverting terminal of the first OP Amp 111 may be connected to both ends of the first source resistor 103. The first OP Amp 111 may sense a first source voltage applied to the first source resistor 103 as the first voltage and output the sensed first source voltage through an output terminal thereof.

Each of a non-inverting terminal and an inverting terminal of the second OP Amp 112 may be connected to both ends of the second source resistor 104. The second OP Amp 112 may sense a second source voltage applied to the second source resistor 104 as the second voltage and output the sensed second source voltage through an output terminal thereof.

The analog to digital converter 130 may receive the first voltage output from the first OP Amp 111 and the second voltage output from the second OP Amp 112, convert each of the first and second voltages into digital signals, and output first and second voltages signals.

The microcontroller 140 may measure an insulation resistance 102 of the battery 101 through a value obtained by dividing a difference between the first voltage of the first voltage signal and the second voltage of the second voltage signal by a sum between the first voltage of the first voltage signal and the second voltage of the second voltage signal.

The microcontroller 140 may receive each of the first voltage of the first voltage signal and the second voltage of the second voltage signal from the analog to digital converter 130, calculate a third voltage obtained by subtracting the second voltage of the second voltage signal from the first voltage of the first voltage signal, a fourth voltage obtained by adding the second voltage to the first voltage, a fifth voltage having an absolute value of the fourth voltage, a sixth voltage obtained by dividing the third voltage by the fifth voltage, a seventh voltage having a voltage of 1V, and an eighth voltage obtained by subtracting the seventh voltage from the sixth voltage, and measure the insulation resistance 102 of the battery 101 through the eighth voltage.

The microcontroller 140 may calculate a ninth voltage obtained by amplifying the eighth voltage to a predetermined value, a tenth voltage having a predetermined reference voltage value, and an eleventh voltage obtained by subtracting the tenth voltage from the ninth voltage in order to more precisely measure the insulation resistance 102 and may measure the insulation resistance 102 of the battery 101 through the eleventh voltage. A detailed description thereof will be provided through the following exemplary embodiment.

As shown in FIG. 2, the first voltage measured at the time of insulation breakdown of a cathode of the battery 101 is given by Equation 12.

$$V1 = \frac{Rs}{R+Rs}\frac{Riso}{2Riso+Rs+R}V \qquad \text{Equation 12}$$

The second voltage measured at the time of the insulation breakdown of the cathode of the battery 101 is given by Equation 13.

$$V2 = -\frac{Rs}{R+Rs}\frac{Riso+Rs+R}{2Riso+Rs+R}V \qquad \text{Equation 13}$$

The third voltage measured at the time of the insulation breakdown of the cathode of the battery 101 is given by Equation 14.

$$V3 = \frac{Rs}{R+Rs}V \qquad \text{Equation 14}$$

The fourth voltage measured at the time of the insulation breakdown of the cathode of the battery 101 is given by Equation 15.

$$V4 = -\frac{Rs}{R+Rs}\frac{R+Rs}{2Riso+Rs+R}V \qquad \text{Equation 15}$$

The first voltage measured at the time of insulation breakdown of an anode of the battery 101 is given by Equation 16.

$$V1 = \frac{Rs}{R+Rs} \frac{Riso+Rs+R}{2Riso+Rs+R} V \qquad \text{Equation 16}$$

The second voltage measured at the time of the insulation breakdown of the anode of the battery 101 is given by Equation 17.

$$V2 = -\frac{Rs}{R+Rs} \frac{Riso}{2Riso+Rs+R} V \qquad \text{Equation 17}$$

The third voltage measured at the time of the insulation breakdown of the anode of the battery 101 is given by Equation 18.

$$V3 = \frac{Rs}{R+Rs} V \qquad \text{Equation 18}$$

The fourth voltage measured at the time of the insulation breakdown of the anode of the battery 101 is given by Equation 19.

$$V4 = \frac{Rs}{R+Rs} \frac{R+Rs}{2Riso+Rs+R} V \qquad \text{Equation 19}$$

Referring to Equations 12 to 19, at the time of both of the insulation breakdown of the cathode and the insulation breakdown of the anode of the battery 101, the fifth voltage may be measured as follows:

$$V5 = \frac{Rs}{R+Rs} \frac{R+Rs}{2Riso+Rs+R} V,$$

and the sixth voltage may be measured as follows:

$$V8 = \frac{2Riso}{Rs+R}$$
$$V6 = 1 + \frac{2Riso}{Rs+R}$$

The eighth voltage measured at the time of the insulation breakdown of the cathode or the insulation breakdown of the anode of the battery 101 is given by Equation 20.

$$V8 = \frac{2Riso}{Rs+R} \qquad \text{Equation 20}$$

The microcontroller 140 may calculate the ninth voltage obtained by amplifying the eighth voltage to a predetermined value in order to more precisely measure the insulation resistance 102. The ninth voltage is given by Equation 21.

$$V9 = \frac{2}{Rs+R} GRiso \qquad \text{Equation 21}$$

The microcontroller 140 may calculate the tenth voltage having a predetermined reference voltage value and the eleventh voltage obtained by subtracting the tenth voltage from the ninth voltage in order to more precisely measure the insulation resistance 102. The eleventh voltage is given by Equation 22.

$$V11 = \frac{2}{Rs+R} GRiso - V10 \qquad \text{Equation 22}$$

Therefore, the insulation resistance $R_{iso}$ 102 of the battery 101 may be measured through the insulation resistance measuring unit 120 or the microcontroller 140. That is, the insulation breakdown of the cathode and the anode of the battery 101 capable of being implemented as the high voltage battery of the hybrid vehicle is judged as one signal to measure the insulation resistance 102, thereby making it possible to more simply and more precisely measure the insulation resistance 102.

The insulation resistance measuring circuit according to another exemplary embodiment of the present invention described with reference to FIG. 2 may be implemented as one-chip. That is, the source resistor unit 103 and 104, the first OP Amp 111, the second OP Amp 112, the analog to digital converter 130, and the microcontroller 140 may be implemented as various kinds of one-chips widely used in the art, that is, a single semiconductor chip.

Although the present invention has been described with reference to the exemplary embodiments and the accompanying drawings, it is not limited to the above-mentioned exemplary embodiments but may be variously modified and changed from the above description by those skilled in the art to which the present invention pertains. Therefore, the scope and spirit of the present invention should be understood only by the following claims, and all of equivalences and equivalent modifications to the claims are intended to fall within the scope and spirit of the present invention.

The invention claimed is:

1. An insulation resistance measuring circuit comprising:
    a source resistor unit including a first source resistor connected between a positive terminal of a battery and a second source resistor and the second source resistor connected between a negative terminal of the battery and the first source resistor;
    a voltage sensing unit sensing a voltage of the first source resistor as a first voltage and sensing a voltage of the second source resistor as a second voltage; and
    an insulation resistance measuring unit measuring an insulation resistance of the battery through a value obtained by dividing a difference between the first and second voltages by a sum between the first and second voltages.

2. The insulation resistance measuring circuit of claim 1, wherein the voltage sensing unit includes:
    a first operational amplifier (OP Amp) connected to the first source resistor through a non-inverting terminal and an inverting terminal thereof, sensing a first source voltage applied to the first source resistor as the first voltage, and outputting the sensed first source voltage through an output terminal thereof; and
    a second OP Amp connected to the second source resistor through a non-inverting terminal and an inverting terminal thereof, sensing a second source voltage applied to the second source resistor as the second voltage, and outputting the sensed second source voltage through an output terminal thereof.

3. The insulation resistance measuring circuit of claim 2, wherein the insulation resistance measuring unit includes:

a first subtracter connected to each of output terminals of the first and second OP Amps and outputting a third voltage obtained by subtracting the second voltage output from the second OP Amp from the first voltage output from the first OP Amp;

an adder connected to each of the output terminals of the first and second OP Amps and outputting a fourth voltage obtained by adding the second voltage output from the second OP Amp to the first voltage output from the first OP Amp;

an absolute value circuit connected to an output terminal of the adder and outputting a fifth voltage having an absolute value of the fourth voltage;

a divider connected to each of the subtracter and the absolute value circuit and outputting a sixth voltage obtained by dividing the third voltage output from the subtracter by the fifth voltage output from the absolute value circuit;

a voltage source outputting a seventh voltage having a voltage of 1V; and a second subtracter connected to each of the divider and the voltage source and outputting an eighth voltage obtained by subtracting the seventh voltage output from the voltage source from the sixth voltage output from the divider.

4. The insulation resistance measuring circuit of claim 3, wherein the insulation resistance measuring unit further includes:

an amplifier connected to the second subtracter and outputting a ninth voltage obtained by amplifying the eighth voltage output from the second subtracter to a predetermined value;

a reference voltage outputter outputting a tenth voltage having a predetermined reference voltage; and a third subtracter connected to each of the amplifier and the reference voltage outputter and outputting an eleventh voltage obtained by subtracting the tenth voltage output from the reference voltage outputter from the ninth voltage output from the amplifier.

5. The insulation resistance measuring circuit of claim 3, wherein when a voltage of the battery is V, the insulation resistance of the battery is $R_{iso}$, each of resistance values of the first and second source resistors is $R_s$, the first voltage is $V_1$, the second voltage is $V_2$, the third voltage is $V_3$, and the fourth voltage is $V_4$, the first to fourth voltages measured at the time of insulation breakdown of a cathode of the battery are as follows:

$$V1 = \frac{Rs}{R+Rs} \frac{Riso}{2Riso+Rs+R} V,$$

$$V2 = -\frac{Rs}{R+Rs} \frac{Riso+Rs+R}{2Riso+Rs+R} V$$

$$V3 = \frac{Rs}{R+Rs} V,$$

$$V4 = -\frac{Rs}{R+Rs} \frac{R+Rs}{2Riso+Rs+R} V.$$

6. The insulation resistance measuring circuit of claim 3, wherein when a voltage of the battery is V, the insulation resistance of the battery is $R_{iso}$, each of resistance values of the first and second source resistors is $R_s$, the first voltage is $V_1$, the second voltage is $V_2$, the third voltage is $V_3$, and the fourth voltage is $V_4$, the first to fourth voltages measured at the time of insulation breakdown of an anode of the battery are as follows:

$$V1 = \frac{Rs}{R+Rs} \frac{Riso+Rs+R}{2Riso+Rs+R} V,$$

$$V2 = -\frac{Rs}{R+Rs} \frac{Riso}{2Riso+Rs+R} V,$$

$$V3 = \frac{Rs}{R+Rs} V,$$

$$V4 = \frac{Rs}{R+Rs} \frac{R+Rs}{2Riso+Rs+R} V.$$

7. The insulation resistance measuring circuit of claim 4, wherein when a voltage of the battery is V, the insulation resistance of the battery is $R_{iso}$, each of resistance values of the first and second source resistors is $R_s$, the first voltage is $V_1$, the second voltage is $V_2$, the third voltage is $V_3$, and the fourth voltage is $V_4$, the fifth voltage is $V_5$, the sixth voltage is $V_6$, the seventh voltage is $V_7$, the eighth voltage is $V_8$, the ninth voltage is $V_9$, the tenth voltage is $V_{10}$, and the eleventh voltage is $V_{11}$, the fifth to eleventh voltages measured at the time of insulation breakdown of a cathode of the battery or insulation breakdown of an anode thereof are as follows:

$$V5 = \frac{Rs}{R+Rs} \frac{R+Rs}{2Riso+Rs+R} V$$

$$V6 = 1 + \frac{2Riso}{Rs+R}$$

$$V8 = \frac{2Riso}{Rs+R}$$

$$V9 = \frac{2}{Rs+R} GRiso$$

$$V11 = \frac{2}{Rs+R} GRiso - V10.$$

8. The insulation resistance measuring circuit of claim 1, wherein the source resistor unit, the voltage sensing unit, and the insulation resistance measuring unit are implemented as one-chip.

9. An insulation resistance measuring circuit comprising:

a source resistor unit including a first source resistor connected between a positive terminal of a battery and a second source resistor and the second source resistor connected between a negative terminal of the battery and the first source resistor;

a first operational amplifier (OP Amp) connected to the first source resistor through a non-inverting terminal and an inverting terminal thereof, sensing a first source voltage applied to the first source resistor as the first voltage, and outputting the sensed first source voltage through an output terminal thereof;

a second OP Amp connected to the second source resistor through a non-inverting terminal and an inverting terminal thereof, sensing a second source voltage applied to the second source resistor as the second voltage, and outputting the sensed second source voltage through an output terminal thereof;

an analog to digital converter connected to each of output terminals of the first and second OP Amps, converting each of the first and second voltages into digital signals, and outputting first and second voltage signals; and a microcontroller measuring an insulation resistance of the battery through a value obtained by dividing a difference between the first voltage of the first voltage signal and the second voltage of the second voltage signal by a sum between the first voltage of the first voltage signal and the second voltage of the second voltage signal.

10. The insulation resistance measuring circuit of claim 9, wherein the microcontroller receives each of the first voltage of the first voltage signal and the second voltage of the second voltage signal from the analog to digital converter, calculates a third voltage obtained by subtracting the second voltage of the second voltage signal from the first voltage of the first voltage signal, a fourth voltage obtained by adding the second voltage to the first voltage, a fifth voltage having an absolute value of the fourth voltage, a sixth voltage obtained by dividing the third voltage by the fifth voltage, a seventh voltage having a voltage of 1V, and an eighth voltage obtained by subtracting the seventh voltage from the sixth voltage, and measures the insulation resistance of the battery through the eighth voltage.

11. The insulation resistance measuring circuit of claim 10, wherein the microcontroller calculates a ninth voltage obtained by amplifying the eighth voltage to a predetermined value, a tenth voltage having a predetermined reference voltage value, and an eleventh voltage obtained by subtracting the tenth voltage from the ninth voltage, and measures the insulation resistance of the battery through the eleventh voltage.

12. The insulation resistance measuring circuit of claim 10, wherein when a voltage of the battery is V, the insulation resistance of the battery is $R_{iso}$, each of resistance values of the first and second source resistors is $R_s$, the first voltage is $V_1$, the second voltage is $V_2$, the third voltage is $V_3$, and the fourth voltage is $V_4$, the first to fourth voltages measured at the time of insulation breakdown of a cathode of the battery are as follows:

$$V1 = \frac{Rs}{R+Rs} \frac{Riso}{2Riso+Rs+R} V,$$

$$V2 = -\frac{Rs}{R+Rs} \frac{Riso+Rs+R}{2Riso+Rs+R} V$$

$$V3 = \frac{Rs}{R+Rs} V,$$

$$V4 = -\frac{Rs}{R+Rs} \frac{R+Rs}{2Riso+Rs+R} V.$$

13. The insulation resistance measuring circuit of claim 10, wherein when a voltage of the battery is V, the insulation resistance of the battery is $R_{iso}$, each of resistance values of the first and second source resistors is $R_s$, the first voltage is $V_1$, the second voltage is $V_2$, the third voltage is $V_3$, and the fourth voltage is $V_4$, the first to fourth voltages measured at the time of insulation breakdown of an anode of the battery are as follows:

$$V1 = \frac{Rs}{R+Rs} \frac{Riso+Rs+R}{2Riso+Rs+R} V,$$

$$V2 = -\frac{Rs}{R+Rs} \frac{Riso}{2Riso+Rs+R} V,$$

$$V3 = \frac{Rs}{R+Rs} V,$$

$$V4 = \frac{Rs}{R+Rs} \frac{R+Rs}{2Riso+Rs+R} V.$$

14. The insulation resistance measuring circuit of claim 11, wherein when a voltage of the battery is V, the insulation resistance of the battery is $R_{iso}$, each of resistance values of the first and second source resistors is $R_s$, the first voltage is $V_1$, the second voltage is $V_2$, the third voltage is $V_3$, and the fourth voltage is $V_4$, the fifth voltage is $V_5$, the sixth voltage is $V_6$, the seventh voltage is $V_7$, the eighth voltage is $V_8$, the ninth voltage is $V_9$, the tenth voltage is $V_{10}$, and the eleventh voltage is $V_{11}$, the fifth to eleventh voltages measured at the time of insulation breakdown of a cathode of the battery or insulation breakdown of an anode thereof are as follows:

$$V5 = \frac{Rs}{R+Rs} \frac{R+Rs}{2Riso+Rs+R} V$$

$$V6 = 1 + \frac{2Riso}{Rs+R}$$

$$V8 = \frac{2Riso}{Rs+R}$$

$$V9 = \frac{2}{Rs+R} GRiso$$

$$V11 = \frac{2}{Rs+R} GRiso - V10.$$

15. The insulation resistance measuring circuit of claim 1, wherein the battery is a high voltage battery for a hybrid vehicle.

16. The insulation resistance measuring circuit of claim 9, wherein the source resistor unit, the first OP Amp, the second OP Amp, the analog to digital converter, and the microcontroller are implemented as one-chip.

* * * * *